(12) United States Patent
Cheung et al.

(10) Patent No.: US 7,369,388 B2
(45) Date of Patent: May 6, 2008

(54) SPARK GAP APPARATUS AND METHOD FOR ELECTROSTATIC DISCHARGE PROTECTION

(75) Inventors: Tim O. Cheung, Santa Barbara, CA (US); Douglas Edgar Fregin, Waterloo (CA)

(73) Assignee: Research in Motion Limited, Waterloo (CA)

( * ) Notice: Subject to any disclaimer, the term of this patent is extended or adjusted under 35 U.S.C. 154(b) by 0 days.

(21) Appl. No.: 11/636,050

(22) Filed: Dec. 8, 2006

(65) Prior Publication Data

US 2007/0081283 A1   Apr. 12, 2007

Related U.S. Application Data

(63) Continuation of application No. 10/881,280, filed on Jun. 30, 2004, now Pat. No. 7,161,784.

(51) Int. Cl.
*H02H 9/00* (2006.01)
(52) U.S. Cl. ........................ 361/111; 361/118
(58) Field of Classification Search ................ 361/111, 361/118
See application file for complete search history.

(56) References Cited

U.S. PATENT DOCUMENTS

| | | | |
|---|---|---|---|
| 5,761,009 A | 6/1998 | Hughbanks et al. | |
| 5,818,101 A | 10/1998 | Schuster | |
| 5,995,353 A | 11/1999 | Cunningham et al. | |
| 6,002,569 A | 12/1999 | Horvath | |
| 6,059,983 A * | 5/2000 | Noble | 427/96.4 |
| 6,084,759 A | 7/2000 | Hansson et al. | |
| 6,215,251 B1 | 4/2001 | Orchard-Webb | |
| 6,241,537 B1 | 6/2001 | Tate et al. | |
| 6,355,958 B1 | 3/2002 | Orchard-Webb | |
| 6,493,198 B1 | 12/2002 | Arledge et al. | |
| 6,930,872 B2 | 8/2005 | Palinkas et al. | |
| 7,067,914 B2 | 6/2006 | Malinowski et al. | |
| 7,161,784 B2 * | 1/2007 | Cheung et al. ............. | 361/111 |
| 2002/0001160 A1 | 1/2002 | Berberich | |
| 2002/0151200 A1 | 10/2002 | Fauser et al. | |
| 2002/0167775 A1 | 11/2002 | Wetter et al. | |
| 2003/0075532 A1 | 4/2003 | Salmon et al. | |
| 2005/0155792 A1 | 7/2005 | Ito et al. | |

FOREIGN PATENT DOCUMENTS

| | | |
|---|---|---|
| EP | 0 610 898 A1 | 8/1994 |
| EP | 1 229 618 A2 | 8/2002 |

OTHER PUBLICATIONS

Using Spark Gaps as ESP Protection for Microcontroller Inputs, pp. 1-6, http://www.8052.com/users/mkaras/SparkGap.phtml.
Ehlers, B., Spark Gaps Provide ESD Protection, Sep. 1, 1997, pp. 1-3, http://www.e-insite.net/ednmag/archives/1997/090197/18di_02.htm.
Designing PCBs for ESD and EMI Compliance, pp. 1-2, http://www.airborn.com.au/method/sparkgap.html.
Gilmore, et al.: "A Componentless, Electrostatic Discharge Technique," Motorola Inc. Technical Developments, vol. 20, Oct. 20, 1993, Schaumburg, IL, US, 1 pg.

* cited by examiner

*Primary Examiner*—Stephen W Jackson
(74) *Attorney, Agent, or Firm*—Jones Day; Krishna K. Pathiyal; Robert C. Liang (57) ABSTRACT

An apparatus for providing electrostatic discharge protection includes a first conductive trace and a second conductive trace. The first conductive trace defines a first conductive periphery and is deposited on a first surface. The second conductive trace defines a second conductive periphery and is deposited on a second surface. The second surface is spaced apart from the first surface by a gap distance and in parallel relation so that a spark gap is defined by the gap distance between the first conductive periphery and the second conductive periphery.

15 Claims, 11 Drawing Sheets

SPARK GAP APPARATUS AND METHOD FOR ELECTROSTATIC DISCHARGE PROTECTION

PRIORITY

This application is a continuation of and claims priority to application Ser. No. 10/881,280 filed Jun. 30, 2004 now U.S. Pat. No. 7,161,784. The entirety of this prior application is hereby incorporated by reference.

BACKGROUND OF THE INVENTION

This disclosure generally relates to electrostatic discharge (ESD) protection devices, methods of manufacturing ESD protection devices, and electronic devices incorporating spark gap ESD protection devices.

Spark gaps are ESD protection devices that comprise two or more spaced apart electrodes having a breakdown voltage dependent on the electrode spacing and geometry. When a voltage across the gap spacing exceeds the breakdown voltage, an arc is created across the spark gap that causes the voltage across the spark gap to clamp to a clamp level.

This disclosure describes novel spark gap fabrication methods and novel spark gap devices. This disclosure also describes novel applications of conventional spark gap devices and novel applications of the novel spark gap devices described herein.

DETAILED DESCRIPTION

Figure 1:
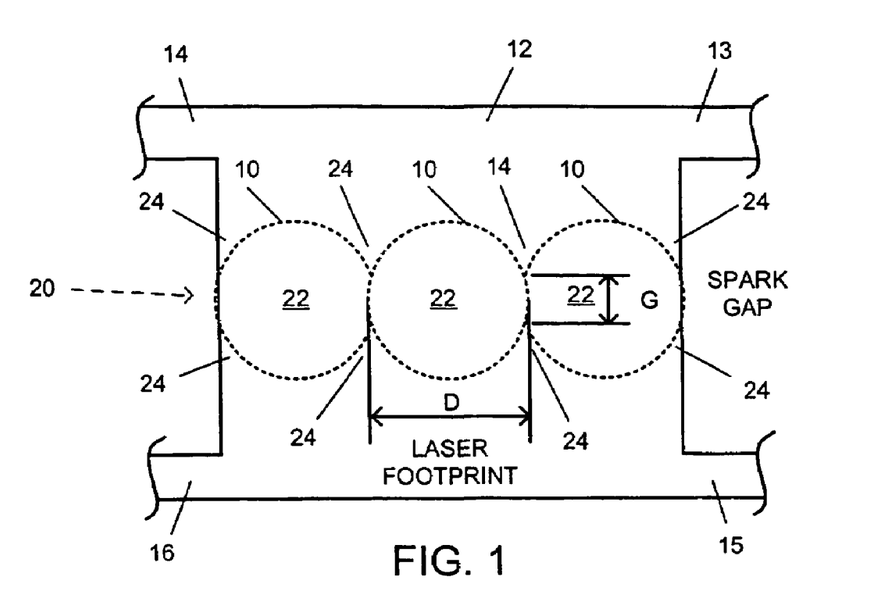
FIG. 1 depicts a plurality of laser footprints in overlapping disposition on a conductor surface.

FIG. 1 depicts a plurality of laser footprints 10 in overlapping disposition on a conductor surface 12. The conductor surface 12 is typically a conductive trace material, such as copper, gold, or the like, that is deposited on a substrate material or integrated into a thin film interconnect layer. Conductive traces 13, 14, 15 and 16 are used to electrically connect electronic circuit elements or to define conductive electrical paths. For example, conductive trace 13 may be connected to signal processing circuitry and conductive trace 14 may be connected to an input pin on a Universal Serial Bus (USB) port, while conductive traces 15 and 16 may be connected to a reference ground.

The laser footprints 10 each have a diameter D within which the conductor surface 12 is etched away when a laser is activated. As the conductor surface 12 is ablated away in each footprint 10, a spark gap 20 is formed. The conductor surface 12 is removed by laser ablation, which results in overlapping arcuate voids 22 in the conductor surface 12 that coincide with the laser footprints 10. A plurality of remaining conductive circumferential extensions 24 define the overlapping arcuate voids 24. The distance G between the tips of the circumferential extensions 24 is the spark gap distance. Typically, the laser ablation will remove to a particular depth the substrate material on which conductive surface is deposited.

Figure 2:
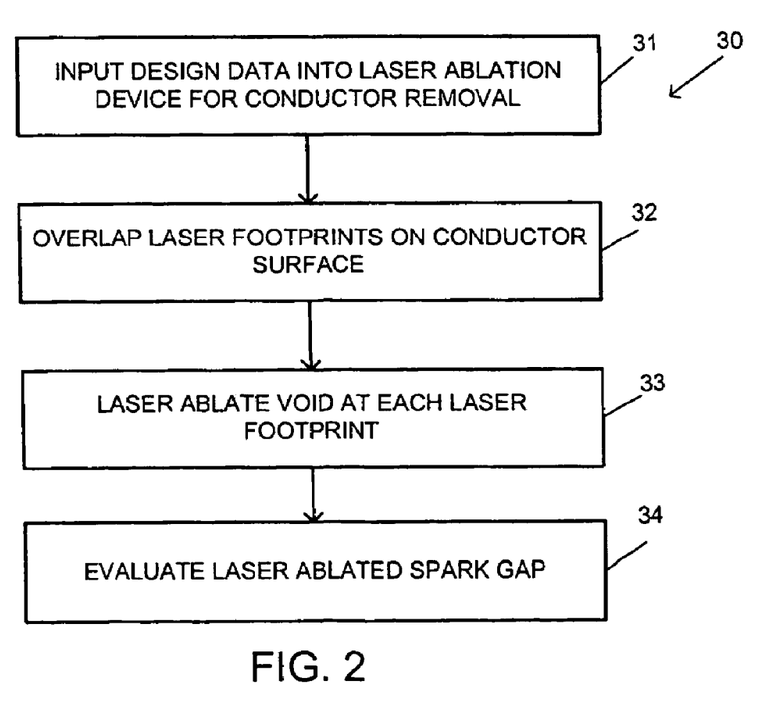
FIG. 2 is a flowchart for a method of fabricating a circumferential extension spark gap device.
Figure 5:
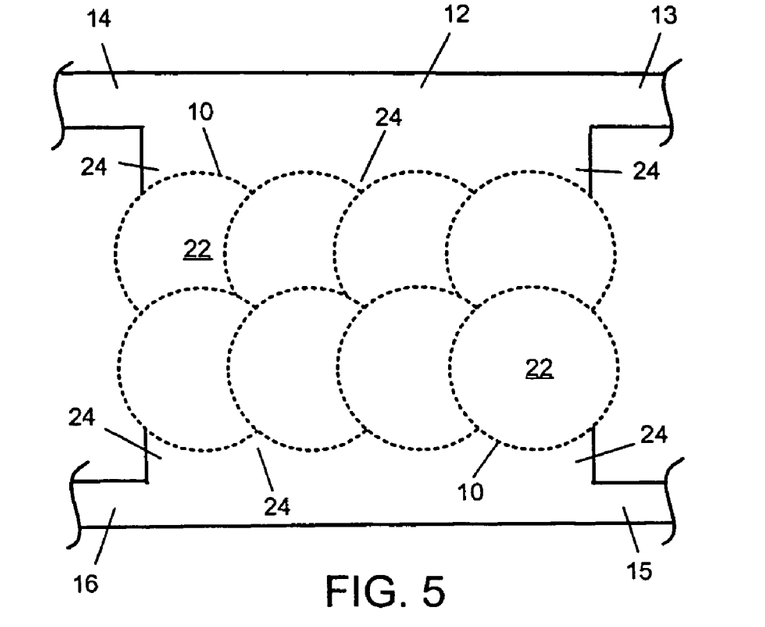
FIG. 5 depicts a plurality of laser footprints in both vertical and horizontal overlapping disposition on a conductor surface.

FIG. 2 is a flowchart 30 for a method of fabricating a circumferential extension spark gap device 20. In step 31, design data is input into a laser ablation device for conductor removal. The design data may comprise data used by a laser ablation device to selectively position and activate a laser used in steps 32 and 33. In step 32, laser footprints are overlapped on a conductor surface. The laser footprints may be overlapped simultaneously, such as when utilizing multiple lasers, or may be overlapped sequentially, such as when using a single laser and redirecting the laser beam relative to the conductor surface. The laser footprints may also be overlapped only in a horizontal direction as shown in FIG. 1, or may be overlapped in both a vertical and horizontal direction, as shown in FIG. 5.

In step 33, a void is laser ablated at each laser footprint. Laser ablation will remove the conductor surface within the laser footprint. After all of the voids in the conductor surface have been created, the resulting conductor surface is separated into two conductive regions separated by a circumferential extension spark gap 20.

In step 34, the laser-ablated spark gap is evaluated. The evaluation may comprise electrical testing, visual inspection, of a combination of both electrical testing and visual inspection.

Figure 3:
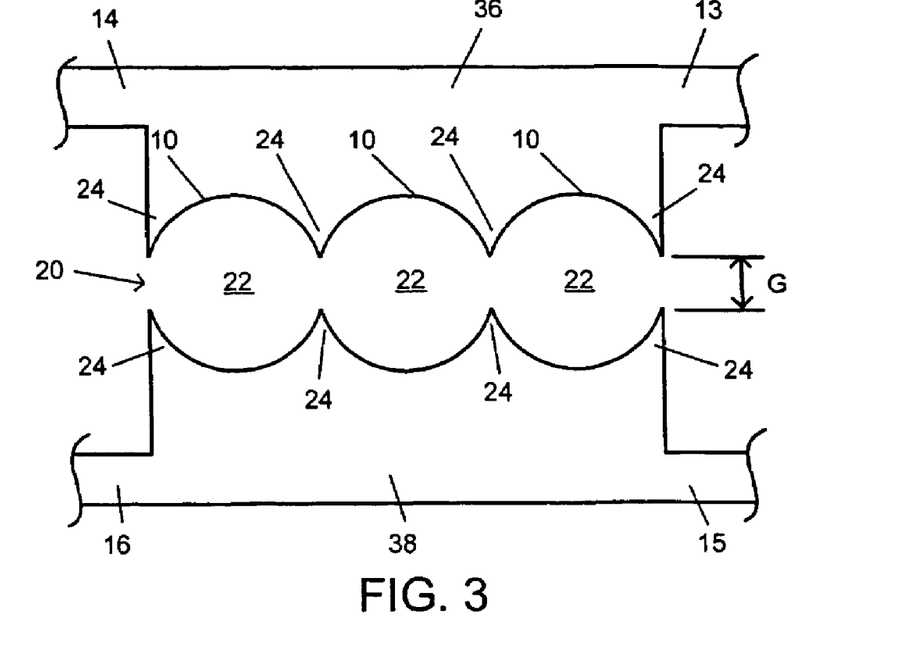
FIGS. 3 and 4 depict example embodiments of a circumferential extension spark gap device.
Figure 4:
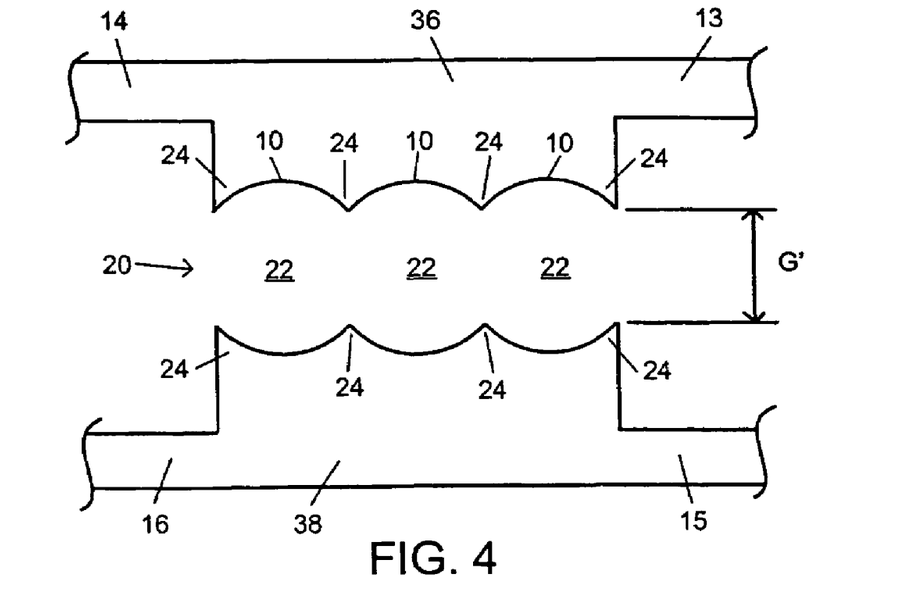

FIGS. 3 and 4 depict example embodiments of a circumferential extension spark gap device 20. Each spark gap 20 comprises a plurality of circumferential extensions 24 that define arcuate voids 22. The arcuate voids 22 in the conductive material separate a first conductor 36 and a second conductor 38. The circumferential extensions 24 on the first conductor 36 are in opposing disposition to the circumferential extensions 24 on the second conductor 38. Conductive traces 13 and 14 of the first conductor 36 are used to electrically connect electronic circuit elements or to define conductive electrical paths. Conductive traces 15 and 16 of the second conductor 38 are used to connect the second conductor to a reference potential, such as a ground.

The spark gap distance may be adjusted by adjusting the amount of overlap in the laser footprints. For example, the overlap amount of the laser footprints in FIG. 3 is less than the overlap amount of the laser footprints in FIG. 4. Accordingly, the spark gap distance G of FIG. 3 is less than the spark gap distance G' of FIG. 4. In one embodiment, the overlap amount of the laser footprints is adjusted to obtain a spark gap distance G of approximately 12 µm. In this embodiment, the laser footprints are horizontally overlapped as in FIG. 4, and thus the spark gap distance G is less than the diameter of the laser footprint.

Figure 6:
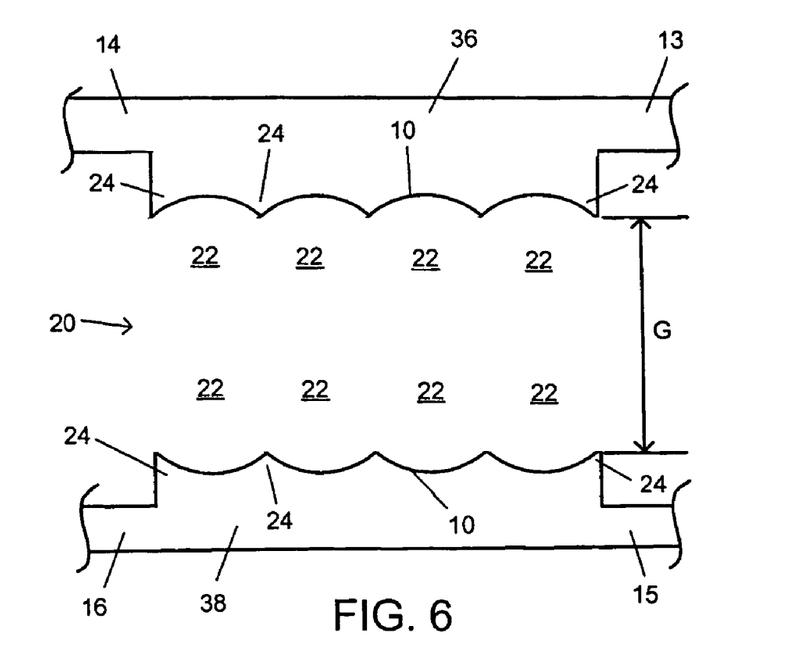
FIG. 6 is an example embodiment of a circumferential extension spark gap device formed by the laser footprint pattern of FIG. 5.

In another embodiment, the laser footprints may be both vertically and horizontally overlapped to adjust the spark gap distance G. FIG. 5 depicts a plurality of laser footprints 22 in both vertical and horizontal overlapping disposition on a conductor surface. FIG. 6 is an example embodiment of a circumferential extension spark gap device 20 formed by the laser footprint pattern of FIG. 5. The circumferential extensions 24 define the arcuate voids 22 for each overlapping laser footprint. Thus, by vertically and horizontally overlapping the laser footprints, the spark gap distance G may be adjusted to a distance greater than the diameter of the laser beam footprint.

While only three void regions 22 are shown in FIGS. 3 and 4, the spark gap 20 may comprise circumferential extensions defining tens, hundreds or even thousands of voids 22. Increasing the number of circumferential extensions tends to increase the durability of the spark gap to repeated use. Additionally, while the laser footprints 10 and/or resultant arcuate voids 22 are depicted as circular, the laser footprints 10 and/or resultant arcuate voids 22 may also comprise other arcuate shapes, depending on the particular laser device implemented.

Figure 7:
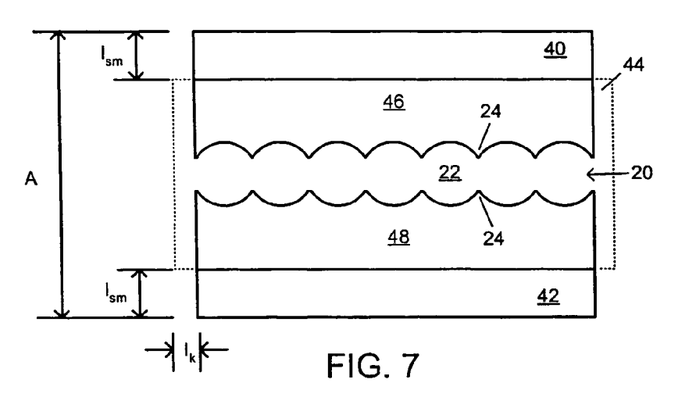
FIG. 7 depicts another embodiment of a circumferential extension spark gap device.

FIG. 7 depicts another embodiment of a circumferential extension spark gap device 20. The spark gap device 20 of FIG. 7 is an embodiment that may be used in a printed circuit board (PCB) or a flex circuit. Conductive surfaces 46 and 48 are covered by solder masks 40 and 42, respectively. A spark gap 20 comprising a plurality of circumferential extensions 24 that define arcuate voids 22 separates the conductive surfaces 46 and 48. A keep-out zone 44 separates the spark gap 20 from adjacent pads. In one embodiment, the solder masks 40 and 42 lengths $l_m$, and the keep out zone 44 length $l_k$ are 0.1 mm, and the surface area of the spark gap device A is 0.5 mm².

Figure 8:
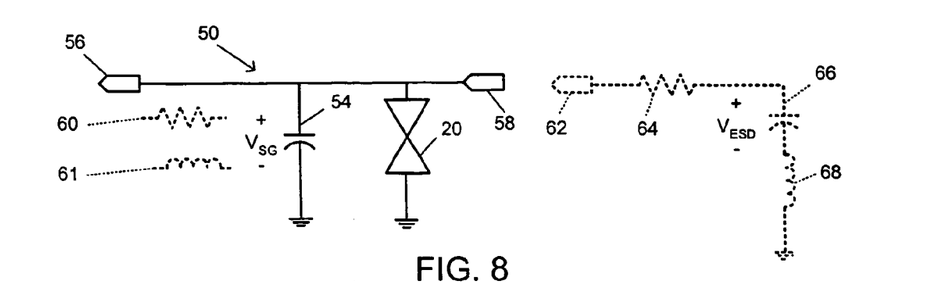
FIG. 8 depicts another embodiment of a spark gap device including a shunt capacitor.

FIG. 8 depicts another embodiment 50 of a spark gap device 20 including a shunt capacitor 54 that is connected in parallel with the spark gap device 20. An ESD sensitive device, such as digital processing circuitry, may be connected to a connection point 56. The connection point 58 defines and ESD entry points, such as a signal line in a USB port. The connection point 62 defines and ESD source, such as a person or an electrical device that may have a different potential than the potential of connection point 58. The ESD energy may be modeled as an energy discharge from a RLC circuit comprising a series connected resistor 64, capacitor 66, and inductor 68.

The shunt capacitor 54 provides additional shunt protection and voltage limiting. The voltage across the spark gap is approximated by the equation:

$$V_{SG} = V_{ESD}(C_{ESD}/(C_{SG}+C_{ESD}))$$

where
$V_{ESD}$ is the voltage across the capacitor 66;
$C_{ESD}$ is the capacitance of capacitor 66; and
$C_{SG}$ is the capacitance of the capacitor 54.

In one embodiment, an optional resistor 60 may be connected in series with the parallel connected spark gap 20 and capacitor 54 to further limit the injection of ESD energy into the ESD sensitive device. Additionally, the resulting reactive network acts as a single-pole filter. In another embodiment, an optional inductor 61 may be connected in series with the parallel connected spark gap 20 and capacitor 54 to further limit the injection of ESD energy into the ESD sensitive device.

Figure 9:
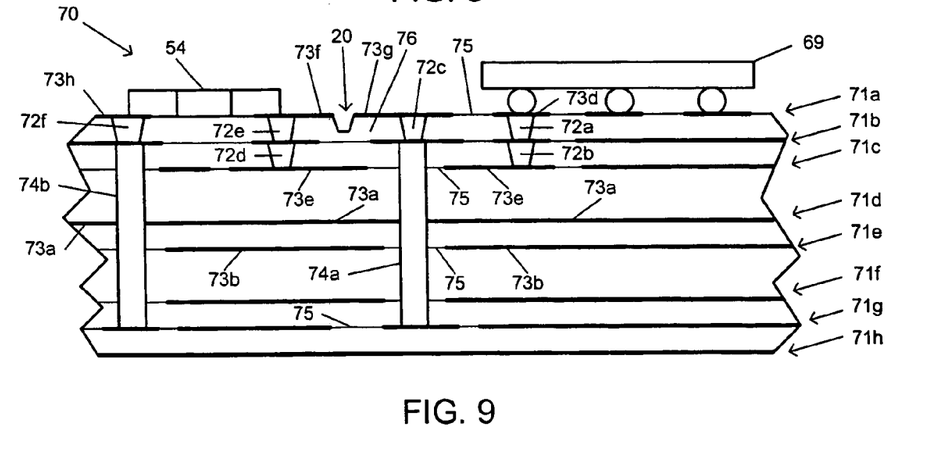
FIG. 9 depicts a side view of a first printed circuit board embodiment of the spark gap device of FIG. 8.

FIG. 9 depicts a side view of a first printed circuit board 70 embodiment of the spark gap device 50 of FIG. 8. The printed circuit board 70 comprises a plurality of levels 71a-h. In particular, levels 71a, 71b, 71c, 71f, 71g and 71h comprises signal levels upon which conductive signal traces are deposited. Level 71d comprises a ground level upon which a conductive ground trace is deposited. Level 71e comprises a power level upon which a conductive power trace is deposited. The conductive signal traces of levels 71a, 71b, 71c, 71f, 71g and 71h are used to conduct electrical data signals. The ground trace of level 71d may be connected to a ground reference potential, such as a $V_{ss}$ potential, and the conductive power trace of level 71e may connected to a power potential, such as a $V_{cc}$ potential.

Conductive traces on each level 71a-h are depicted by their thickened side profiles 73 relative to surfaces 75 that represent the demarcation between printed circuit board levels. For example, the conductive trace 73a that is deposited on ground level 71d may comprises a ground trace or a ground plane. The conductive trace 73a is also connected to ground vias 74a and 74b to provide access to the ground potential in other layers of the printed circuit board. Each ground via 74a and 74b comprises a conductive trace deposited on the interior surface of the via, or may comprise a conductive core filling the interior region of the via. The conductive trace 73b on power level 71f is not connected to the ground vias 74a and 74b, as represented by the surface area 75 interposed between the conductive trace 73b and ground vias 74a and 74b. Likewise, the conductive trace 73e on signal level 71c is not connected to the ground via 74a, as represented by the surface area 75 interposed between the conductive trace 73e and ground via 74a.

Conductive trace interconnections between levels 71 may also be established by conductive vias 72. Each conductive via 72 comprises a conductive trace deposited on the interior surface of the via, or may comprise a conductive core filling the interior region of the via. For example, in the cross section shown, conductive trace 73d is connected to conductive trace 73e through conductive vias 72a and 72b. Likewise, the conductive trace 73e is connected to conductive trace 73f through conductive vias 72c and 72d; conductive trace 73g is connected to ground via 74a by conductive via 72c; and conductive trace 73h is connected to ground via 74b through conductive via 72f.

A top signal layer 71a are a surface mount capacitor 54 and a ball grid array (BGA) mounted electrical device 69. Other mounting methods other than those shown may also be used. The electrical device 69 may comprise any electrical device having or requiring ESD protection, such as a discrete electrical component, an integrated circuit, and the like.

A circumferential spark gap 20, which comprises conductive traces 73f and 73g, is interposed between one terminal of the capacitor 54 and ground via 74a. The spark gap 20 is formed by the laser ablation process described above. The laser ablation typically removes a particular depth of the substrate material upon which the conductive material is deposited, as indicated in the slightly conical depression in the dielectric 76 beneath the spark gap 20.

Conductive trace 73g of the spark gap 20 is connected to the ground via 74a through conductive via 72c. The other conductive trace 73f of the spark gap 20 is connected to one terminal of the capacitor 54 through conductive vias 72d and 72e, and also to conductive trace 73e. The conductive trace 73e, in turn, is connected to the electronic device 69 through conductive vias 72a and 72b and conductive trace 73d. Additionally, the other end of the capacitor 54 is connected to the ground via 74b through conductive trace 72f. Thus, the capacitor 54 and the spark gap 20 are interposed in parallel between the electrical device 69 and ground to provide spark gap ESD protection with a parallel shunt capacitance.

Figure 10:
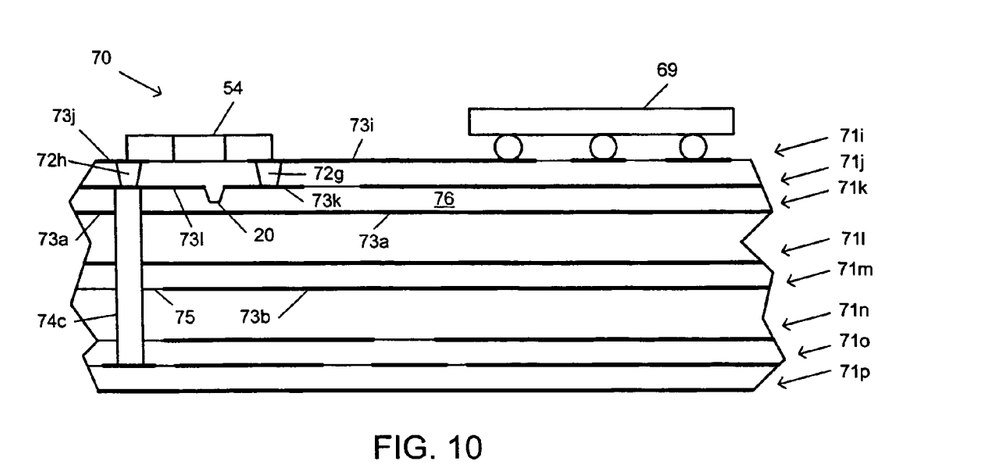
FIG. 10 depicts a side view of a second printed circuit board embodiment of the spark gap device of FIG. 8.

FIG. 10 depicts a side view of a second printed circuit board 70 embodiment of the spark gap device of FIG. 8. The printed circuit board 70 of FIG. 10 comprises signal levels 71i, 71j, 71n, 71o and 71p, ground levels 71k and 71l, and power level 71m. This embodiment is similar to the embodiment of FIG. 9, except that the circumferential spark gap is fabricated in a layer beneath the top layer 71i.

Figure 11:
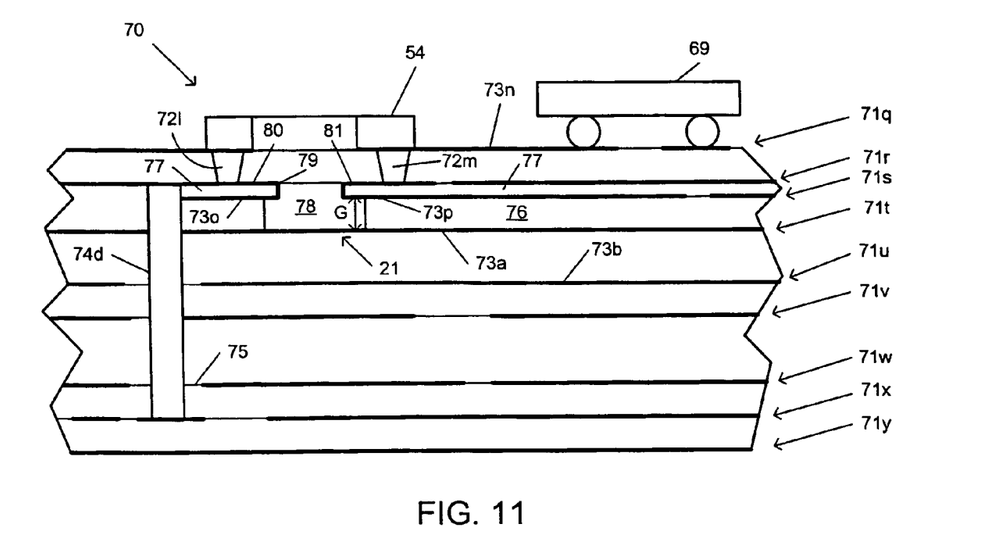
FIG. 11 depicts a side view of a third printed circuit board embodiment of the spark gap device of FIG. 8.

FIG. 11 depicts a side view of a third printed circuit board 70 embodiment of the spark gap device of FIG. 8. The printed circuit board 70 of FIG. 11 comprises signal levels 71q, 71r, 71s, 71v, 71w and 71x, ground levels 71t and power level 71u. Signal level 71r further comprises a thin laminate 77 upon which one or more conductive traces may be deposited. The thin laminate 77 is used to form a spark gap 21. The laminate 77 includes a periphery 79 that defines an opening. The open is placed over a space 78 in the dielectric 76 and extends over the periphery defined by the space 78. In the embodiment shown in FIG. 11, the geometry of the opening in the laminate 77 is such that the laminate 77 extends over the sides of the dielectric space 78.

A first side 80 of the opening comprises a conductive trace and is connected to a ground via 74d and a first terminal of the capacitor 54 through conductive via 72l. A second side 81 of the opening likewise comprises a conductive trace and is connected to a conductive via 72m. The conductive via 72m is, in turn, connected to the other terminal of the capacitor 54 and the electronic device 69 by conductive trace 73n. Spark gap protection is thus provided by the gap formed by the conductive trace 73p on the second side 81 of the opening and the conductive ground trace 73a. Thus, the capacitor 54 and the spark gap 21 are interposed in parallel between the electrical device 69 and ground to provide spark gap ESD protection.

A shunt capacitor may also be fabricated directly in the printed circuit board 70. For example, in FIG. 11, the dielectric 76 interposed between the laminate 77 and the conductive ground trace 73a may be selected so that the dielectric 76 and the conductive traces 73a and 73p form a capacitor. Accordingly, a first terminal of the capacitor is connected to the electrical device 69 through the conductive via 72m and conductive trace 73n. The second terminal of the capacitor comprises the conductive ground trace 73a, and thus the capacitor 54 and the spark gap 21 are interposed in parallel between the electrical device 69 and ground to provide spark gap ESD protection.

Figure 12:
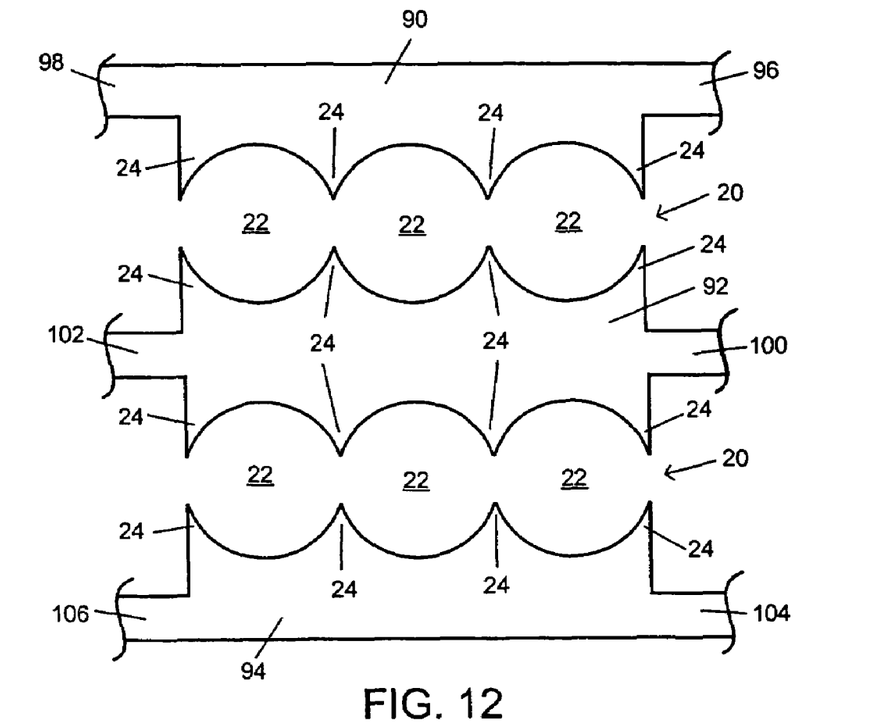
FIG. 12 depicts another embodiment of a circumferential extension spark gap device.

FIG. 12 depicts another embodiment of a circumferential extension spark gap device 20. In this embodiment, conductor 90 and conductive traces 96 and 98 comprise a first signal path, and conductor 94 and conductive traces 104 and 106 comprise a second signal path. Conductive traces 100 and 102 are connected to a ground reference so that conductor 92 provides a spark gap ground reference. Each spark gap 20 is similar to the spark gaps described with respect to FIGS. 1-6 above, and comprises a plurality of conductive circumferential extensions 24 that define voids 22 in the conductive surface.

Figure 13:
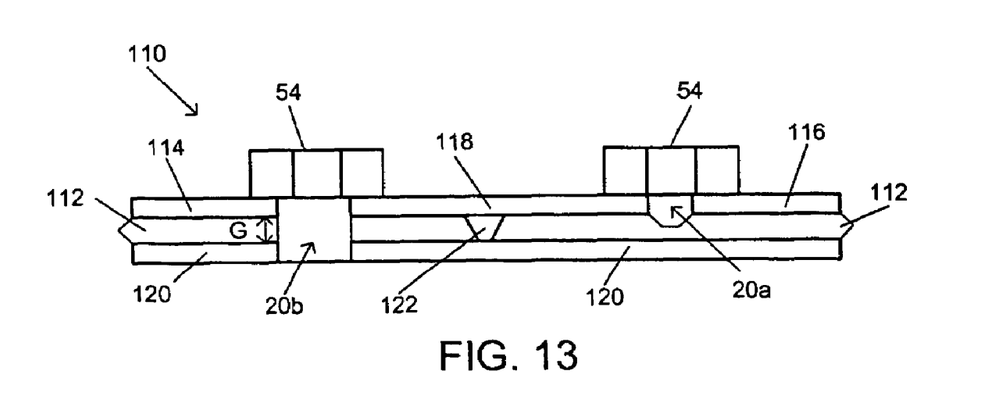
FIGS. 13 and 14 depict side and top views of a spark gap device in a flex circuit.
Figure 14:
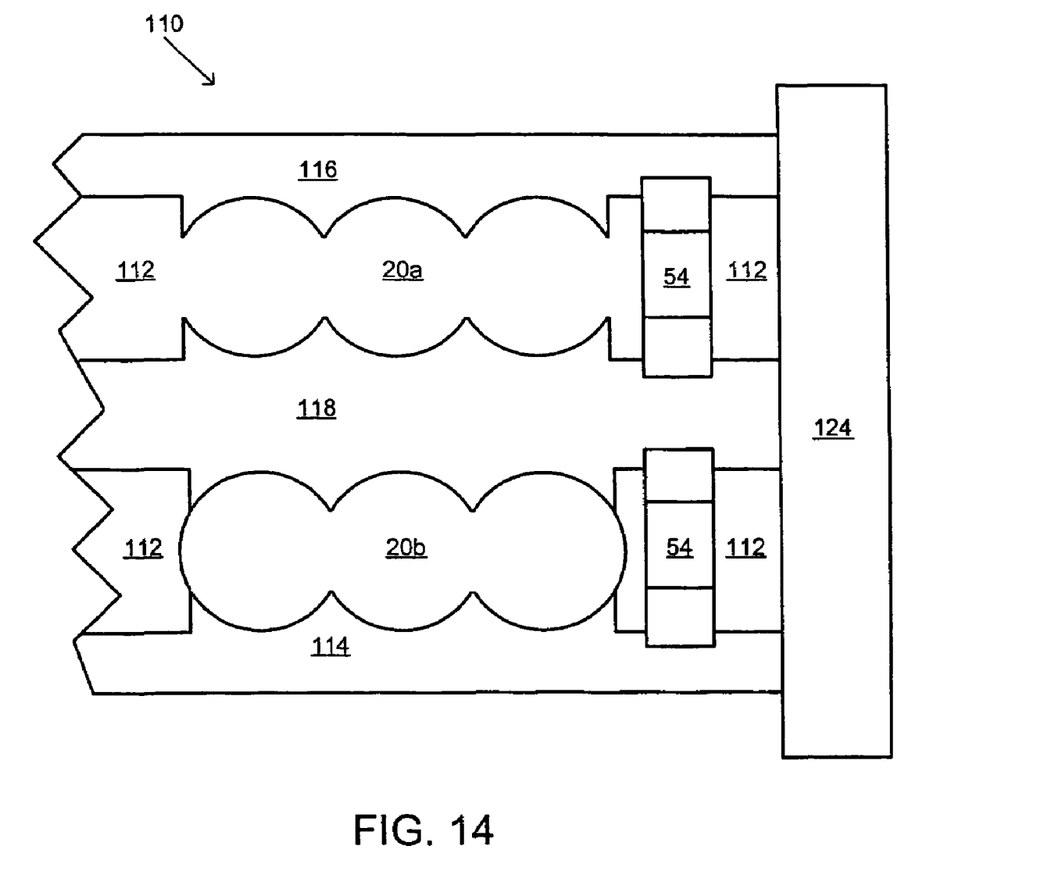

FIGS. 13 and 14 depict side and top views, respectively, of a spark gap device in a portion of a flex circuit 110. The flex circuit 110 comprises a flexible dielectric or insulating material 112. In one embodiment, the flexible material comprises a polyimide material. Other flexible materials may also be used, such as a liquid crystal polymer (LCP) material. In another embodiment, the dielectric 112 may be selected so that the dielectric constant and the conductive traces between which the dielectric is interposed form a capacitor.

Conductive traces 114, 116 and 118 are positioned near the top layer of the flex circuit 110. A bottom conductive trace comprises a conductive ground trace 120. The conductive trace 118 is connected to the conductive ground trace 120 through a conductive via 122. Conductive traces 114 and 116 may be connected to signal processing circuitry or data transmission, such as a semiconductor device or a input pin on a connector 124.

A first spark gap 20a is interposed between the conductive traces 116 and 118, and connected in parallel to a capacitor 54. The first spark gap 20a is laser ablated to a depth that does not exceed the depth of the dielectric 112. A second spark gap 20b is interposed between the conductive traces 114 and 118, and connected in parallel to a capacitor 54. The second spark gap 20 is laser ablated to a depth that extends through the flex circuit. The second spark gap 20b thus is also vertically disposed, providing alternate ESD protection via distance G that is defined by the thickness G of the dielectric or insulating material 112. Thus, the second spark gap 20b comprises the entire periphery of the conductor edges defining the arcuate voids 22. Capacitors 54 may be optionally connected in parallel with the spark gaps 20a and 20b to provide additional shunt capacitance protection.

Figure 15:
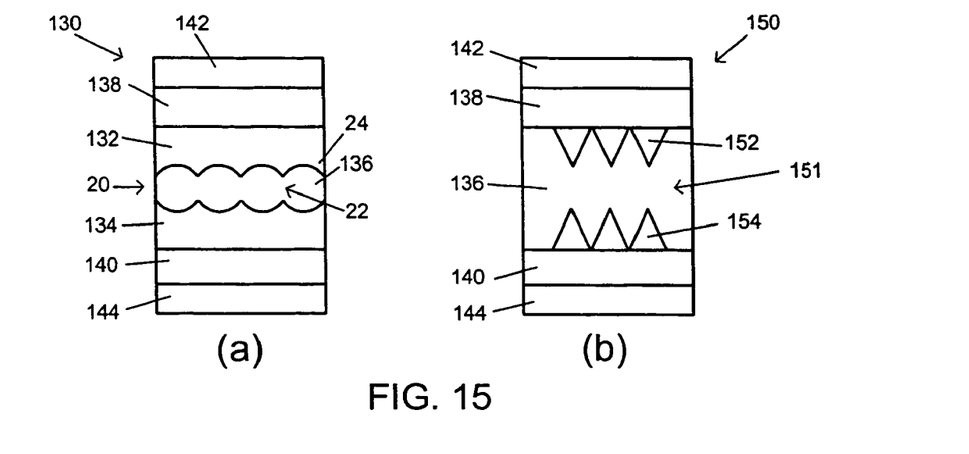
FIG. 15 depicts example embodiments of spark gap devices integrated into surface mount components.

FIG. 15 depicts example embodiments of spark gap devices integrated into surface mount components 130 and 150. FIG. 13(a) depicts a surface mount component 130 having a spark gap device comprising circumferential extensions 24 defining overlapping arcuate voids 22 as described with respect to FIGS. 1-4 above. FIG. 13(b) depicts a surface mount component 150 having a spark gap 151 comprising angled extension. The spark gap 151 of FIG. 13(b) may be constructed by a chemical etching process, or by photolithography masking, or other fabrication methods.

Each of the surface mount components 130 and 150 also comprise solder masks 138 and 140 and solder tabs 142 and 144. The spark gap and solder masks 138 and 140 may be distributed on one surface of an insulator 136. The surface mount components 130 and 150 may also comprise a circuit element disposed between the solder tabs 142 and 144 so that the spark gap is connected to the solder tabs 142 and 144 in parallel with the circuit element. The spark gap thus provides bi-directional ESD protection to the electrical element and may further limit over-voltage spikes to a nondestructive level.

Figure 16:
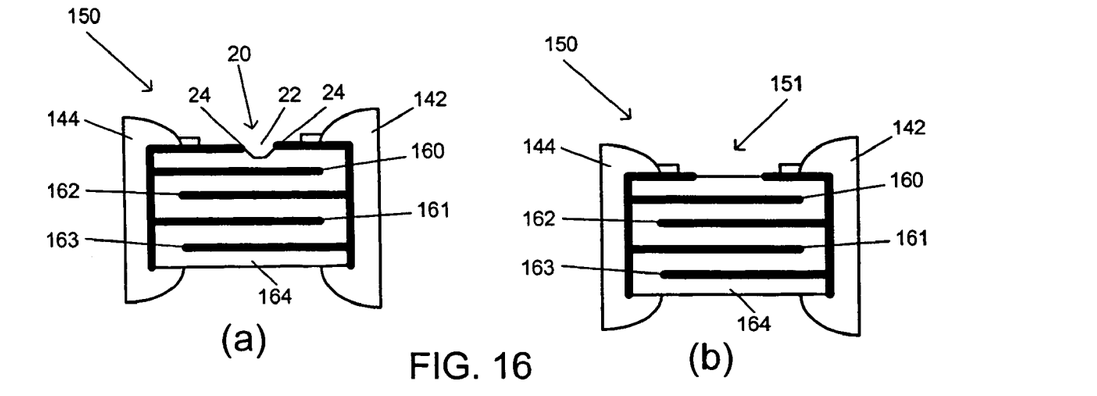
FIG. 16 depicts an example embodiment of a spark gap device in a surface mount capacitor.

The circuit elements may comprise passive circuit components, such as a resistor, inductor or capacitor. FIG. 16 depicts an example embodiment of a spark gap device in a surface mount capacitor 150. The capacitor 150 comprises interlayered electrode plates 160, 161, 162 and 163 and an interposing dielectric 164. The electrode plates 160 and 161 are connected to the solder tab 144, and the electrode plates 162 and 163 are connected to the solder tab 142. A circumferential spark gap device 20 comprising circumferential extensions 24 that define arcuate voids 22 is connected to the solder tabs 142 and 144 in parallel with the electrode plates 160, 161, 162 and 163. Although the novel spark gap device 20 of FIGS. 1-6 is implemented in the embodiment of FIG. 16, other spark gap devices comprising a different geometry may also be used, such as the angled spark gap device of FIG. 15(b).

Figure 17:
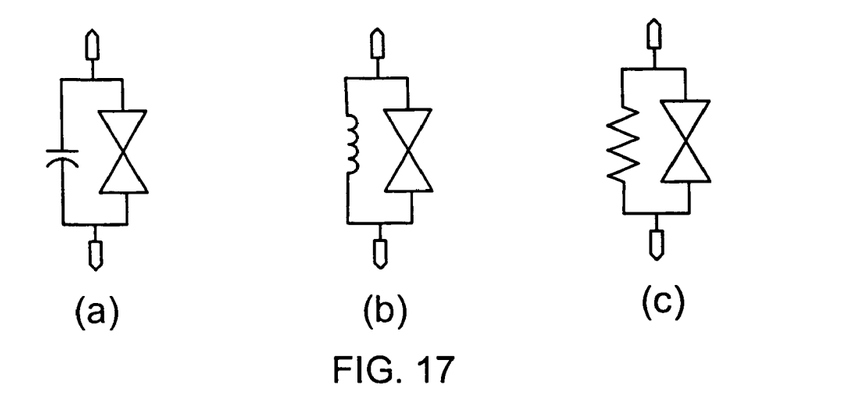
FIG. 17 provides a plurality of circuit representations for various surface mount components having integrated spark gap devices.

FIG. 17 provides a plurality of circuit representations for various surface mount components having integrated spark gap devices. FIGS. 15(a), (b) and (c) depict circuit representations for a surface mount capacitor, inductor, and resistor, respectively. The components of FIGS. 15(a), (b) and (c) may facilitate a variety of implementations. For example, the resistor device of FIG. 17(c) may be implemented as a protected resistor, or may alternative be implemented as a spark gap having a high bypass resistance. Other two-terminal circuit elements may also be used, and other packing schemes may likewise be used. For example, a two-terminal, multi-pole filter may be protected by the parallel spark gap device of FIG. 15. Likewise, the parallel spark gap device may also be used to protect other packaging, such as dual in-line (DIP) or small-outline integrated circuit (SOIC) packaging, or be used in conjunction with an IC socket and module.

The capacitance of the spark gap device 20 may also be considered when fabricating the circuit element. For example, if the characteristic capacitance of a circumferential spark gap device 20 is 0.1 pF, and a surface mount component is to provide a capacitance of 10 pF, then the value of the actual capacitor to be connected in parallel with the spark gap device 20 may be adjusted accordingly so that the terminal capacitance is 10 pF.

Figure 18:
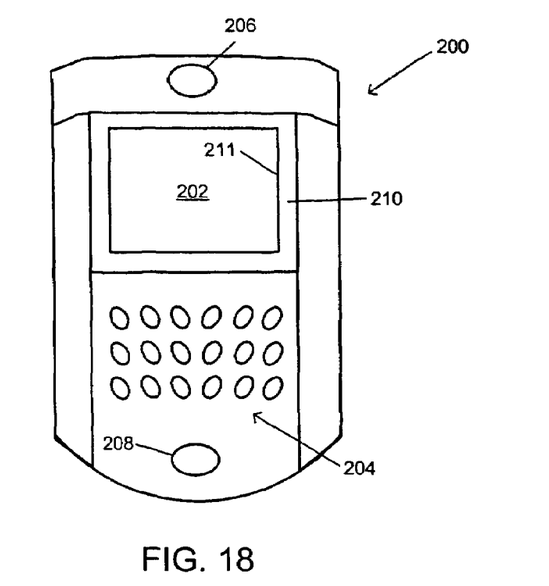
FIG. 18 depicts a top view of a mobile communication device.

FIG. 18 depicts a top view of a mobile communication device 200. The spark gap device of FIGS. 1-4 may be implemented in the mobile communication device 200 to provide ESD protection to ESD-sensitive components. The mobile communication device 200 may have a data communication capability, a voice communication capability, or a combination of data and voice communication capability. The housing of the mobile communication device 200 may include a conductive surface, such as a metal bezel 210 having an interior edge 211. The interior edge 211 defines an opening for viewing a display assembly 202, such as a liquid crystal display (LCD). A keyboard 204, a speaker 206 and a microphone 208 are provided to facilitate voice and data communications.

The mobile device 200 is operable to communicate over a wireless network via a radio frequency link. The metal bezel 210 is an entry point for ESD energy. Typically, however, grounding the metal bezel 210 directly to ground will cause a high capacitive coupling to the mobile device 200 antenna and cause RF communication performance degradation. Accordingly, a spark gap device is implemented to provide ESD protection and minimize capacitive coupling, and reroutes the destructive ESD to a PCB ground.

Figure 19:
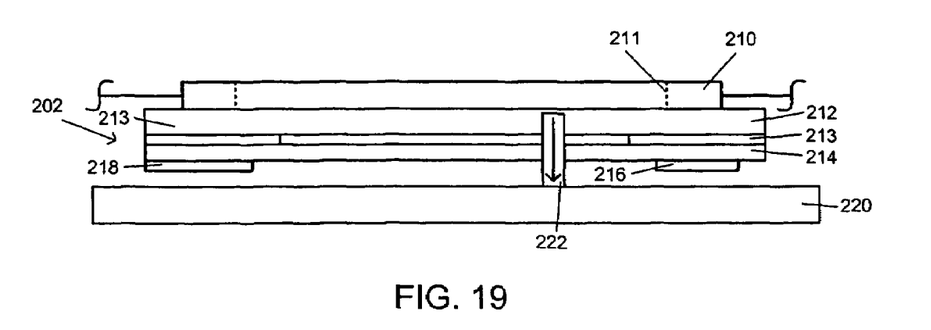
FIG. 19 depicts a spark gap device for providing ESD protection from a metal surface case component of the mobile communication device.

FIG. 19 depicts a spark gap device 222 for providing ESD protection from a metal surface case component 210 of the mobile communication device 200. A spark gap device 222 provides ESD protection of an LCD assembly 202 by providing a spark gap from the metal bezel 210 to a ground potential on a PCB 220. The LCD assembly 202 may comprise a display window 212, a display gasket 213, an LCD module 214, a LCD driver chip 216, and an LCD I/O connector 218.

Figure 20:
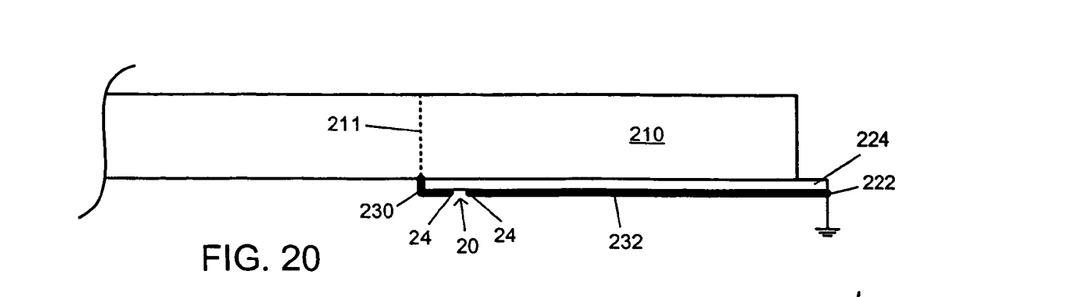
FIGS. 20 and 21 depict side and bottom views of one embodiment of a spark gap device for providing ESD protection from a metal surface case component of the mobile communication device.
Figure 21:
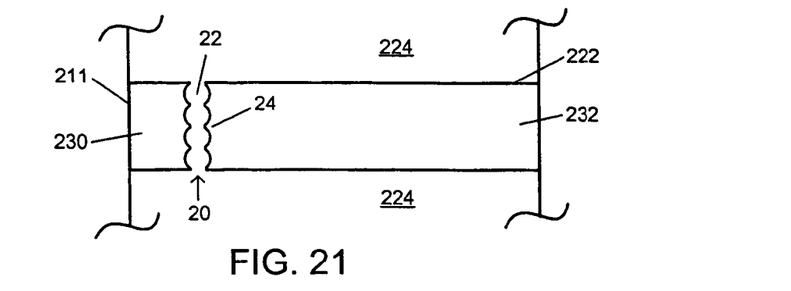

FIGS. 20 and 21 depict side and bottom views of one embodiment of a spark gap device for providing ESD protection from a metal surface case component 210 of the mobile communication device 200. In this embodiment, the circumferential spark gap of FIGS. 1-6 is used. An insulator 224 separates the spark gap device 222 from the metal bezel 210. A first conductor 230 is connected to the metal bezel 210, proximate to the interior edge 211. A second conductor 232 is connected to a reference ground potential. The first and second conductors 230 and 232 are separated by a spark gap 20 comprising circumferential extensions 24 that define a plurality of overlapping arcuate voids 24.

Figure 22:
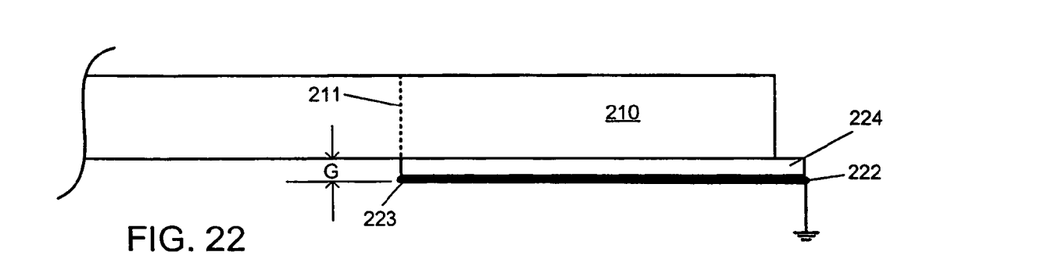
FIGS. 22 and 23 depict side and bottom views of another embodiment of a spark gap device for providing ESD protection from a metal surface case component of the mobile communication device.
Figure 23:
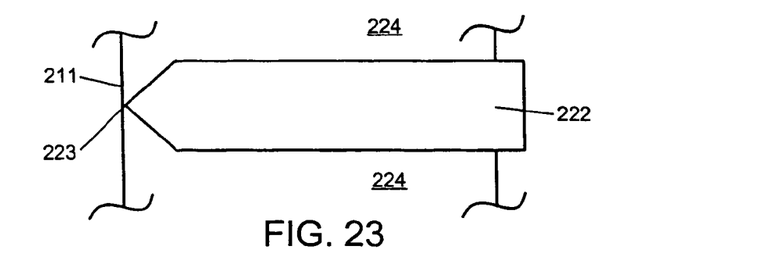

FIGS. 22 and 23 depict side and bottom views of another embodiment of a spark gap device for providing ESD protection from the metal surface case component 210 of the mobile communication device 200. In this embodiment, a triangular shaped spark gap 223 is used. The triangular shaped spark gap 223 is separated from the interior edge 211 of the metal bezel 210 by a gap distance G. An insulator 224 is used to separate the conducting surface of the spark gap device 224 from the metal bezel 210. The other end of the spark gap device 224 is connected to a reference ground potential. In one embodiment, a poron strip is used to realize the spark gap device 224. In another embodiment, two conductors with triangle terminations are used to provide a triangular spark gap. This embodiment is similar to the embodiment of FIGS. 18 and 19, except that the spark gap comprises a triangular geometry instead of the circumferential geometry.

Figure 24:
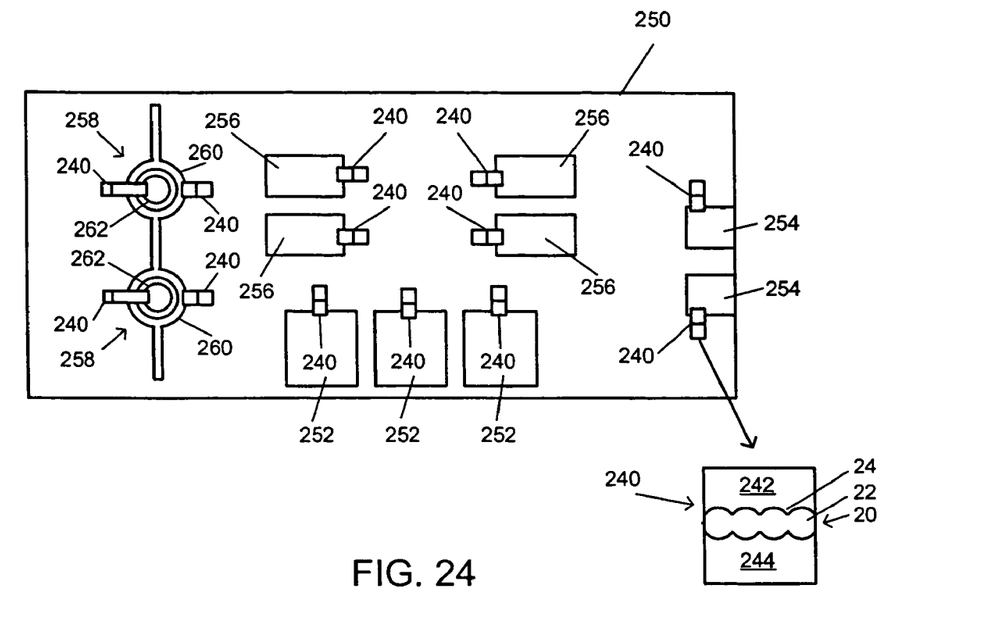
FIG. 24 is an example printed circuit board (PCB) having integrated circumferential extension spark gap devices for providing ESD protection.

The spark gap devices 20 described herein may be configured to protect other circuitry in the mobile communication device 200. FIG. 24 is an example PCB 250 having integrated circumferential extension spark gap devices 240 for providing ESD protection. Each integrated circumferential spark gap device 240 comprises a first conductor 242 and a second conductor 244 separated by a spark gap 20 comprising a plurality of circumferential extensions 24 that define arcuate voids. The integrated circumferential spark gap devices 240 may be distributed to protect any ESD sensitive circuitry connected to an ESD entry point, such as battery contacts 252, I/O device jacks 254, SIM contacts 256, and/or keypad dome switches 258.

Keypad dome switches 258 comprise a conductive trace 260 and a conductive center pad 262. Each section of the conductive trace 260 defining a keypad area is connected to an integrated circumferential spark gap device 240. Likewise, each conductive center pad 262 is connected to an integrated circumferential spark gap device 240. In the embodiment shown, integrated circumferential spark gap devices 240 connected to the conductive center pad 262 are insulated from the conductive trace 260.

Figure 25:
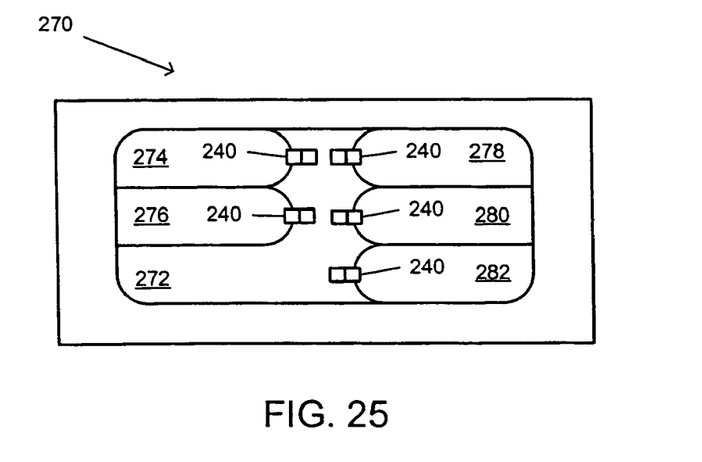
FIG. 25 is an example subscriber identity module (SIM) card having integrated circumferential extension spark gap devices for providing ESD protection.

The integrated circumferential spark gap devices 240 may also protect removable electronic devices. FIG. 25 is an example subscriber identity module (SIM) card 270 having integrated circumferential extension spark gap devices 240 for providing ESD protection. The integrated circumferential spark gap devices 240 are interposed between a reference potential surface 272 and a power contact 274, a first data contact 276, a clock contact 278, a reset contact 280, and a second data contact.

The embodiments described herein are examples of structures, systems or methods having elements corresponding to the elements of the invention recited in the claims. This written description may enable those of ordinary skill in the art to make and use embodiments having alternative elements that likewise correspond to the elements of the invention recited in the claims. The intended scope of the invention thus includes other structures, systems or methods that do not differ from the literal language of the claims, and further includes other structures, systems or methods with insubstantial differences from the literal language of the claims.

What is claimed is:

1. A mobile communication device comprising:
   a device housing;
   a display;
   a keyboard; and
   a spark gap device for providing electrostatic discharge protection, comprising:
      a first conductive trace defining a first conductive periphery and deposited on a first surface;
      a second conductive trace defining a second conductive periphery deposited on a second surface, the second surface spaced apart from the first surface by a gap distance and in parallel relation so that a spark gap is defined by the gap distance between the first conductive periphery and the second conductive periphery; and
      a dielectric layer defining first and second layer surfaces and a first opening having a first inner periphery, and wherein the first surface comprises a laminate surface attached to the first layer surface and defining a second opening having a second inner periphery, the second inner periphery positioned so that the second inner periphery extends over the first opening and beyond the first inner periphery.

2. The mobile communication device of claim 1 wherein the device housing further comprises a conductive surface having an interior edge defining an opening for viewing the display.

3. The mobile communication device of claim 1 wherein the display is a liquid crystal display.

4. The mobile communication device of claim 2 wherein the conductive surface is a metal bezel.

5. The mobile communication device of claim 1, wherein the second conductive trace is deposited on the second layer surface.

6. The mobile communication device of claim 1, wherein the first and second surfaces comprise surface layers in a printed circuit board.

7. The mobile communication device of claim 1, wherein the first and second surfaces comprise surface layers in a flex circuit.

8. The mobile communication device of claim 1, wherein the first and second conductive peripheries comprise a plurality of circumferential extensions defining void regions.

9. The mobile communication device of claim 8, wherein the void regions are formed with photolithography.

10. A mobile communication device including a substrate defining a first and a second surface, comprising:
    means for forming a first opening defining a first inner periphery through a substrate;
    means for forming a second opening defining a second inner periphery through a laminate;
    means for depositing a first conductive surface on a first surface of the laminate;
    means for placing the first surface of the substrate in contact with a second conductive surface;
    means for placing the first surface of the laminate on the second surface of the substrate; and
    means for positioning the laminate so that the second inner periphery extends over the first opening and beyond the first inner periphery.

11. The mobile communication device of claim 10 wherein the menas for placing a first surface of the substrate in contact with the second conductive surface comprises means for depositing the second conductive surface on the first surface of the laminate so that that the first surface of the substrate defines a conductive periphery.

12. A mobile communication device comprising:
    a subscriber identity module (SIM) card; and
    a circumferential extension spark gap device integrated into the SIM card,
    the circumferential extension spark gap device including:
       a first conductive trace defining a first conductive periphery and deposited on a first surface;
       a second conductive trace defining a second conductive periphery deposited on a second surface, the second surface spaced apart from the first surface by a gap distance and in parallel relation so that a spark gap is defined by the gap distance between the first conductive periphery and the second conductive periphery; and
       a dielectric layer defining first and second layer surfaces and a first opening having a first inner periphery, and wherein the first surface comprises a laminate surface attached to the first layer surface and defining a second opening having a second inner periphery, the second inner periphery positioned so that the second inner periphery extends over the first opening and beyond the first inner periphery.

13. The mobile communication device of claim 12 wherein the circumferential spark gap device is interposed between a reference potential surface, a power contact, a first data contact, a clock contact, a reset contact, and a second data contact.

14. The mobile communication device of claim 12, wherein the second conductive trace is deposited on the second layer surface.

15. A mobile communications device comprising:
    a device for providing electrostatic discharge protection, including:
       a dielectric layer defining first and second layer surfaces and a first opening having a first inner periphery, and wherein a first surface comprises a laminate surface attached to the first layer surface and defining a second opening having a second inner periphery, the second inner periphery positioned so that the second inner periphery extends over the first opening and beyond the first inner periphery.

* * * * *

UNITED STATES PATENT AND TRADEMARK OFFICE
CERTIFICATE OF CORRECTION

PATENT NO. : 7,369,388 B2 Page 1 of 1
APPLICATION NO. : 11/636050
DATED : May 6, 2008
INVENTOR(S) : Cheung et al.

It is certified that error appears in the above-identified patent and that said Letters Patent is hereby corrected as shown below:

Column 10, line 16, please replace "menas" with -- means --
Column 10, line 19, please replace "that that" with -- that --

Signed and Sealed this

Twenty-eighth Day of July, 2009

JOHN DOLL
*Acting Director of the United States Patent and Trademark Office*